United States Patent
Afzali-Ardakani et al.

(10) Patent No.: US 8,691,675 B2
(45) Date of Patent: Apr. 8, 2014

(54) VAPOR PHASE DEPOSITION PROCESSES FOR DOPING SILICON

(75) Inventors: Ali Afzali-Ardakani, Yorktown Heights, NY (US); Damon B. Farmer, Yorktown Heights, NY (US); Lidija Sekaric, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 240 days.

(21) Appl. No.: 12/625,835

(22) Filed: Nov. 25, 2009

(65) Prior Publication Data
US 2011/0124187 A1 May 26, 2011

(51) Int. Cl.
*H01L 21/04* (2006.01)
(52) U.S. Cl.
USPC .......................... 438/510; 438/514
(58) Field of Classification Search
USPC .................................. 438/510, 514
See application file for complete search history.

(56) References Cited

U.S. PATENT DOCUMENTS

| | | | |
|---|---|---|---|
| 5,225,378 A | 7/1993 | Ushikawa | |
| 5,244,831 A | 9/1993 | Hindman et al. | |
| 5,824,596 A | 10/1998 | Naem | |
| 6,461,948 B1 | 10/2002 | Rapp et al. | |
| 6,982,214 B2 | 1/2006 | Fu et al. | |
| 7,125,815 B2 | 10/2006 | Vaartstra | |
| 7,230,819 B2 | 6/2007 | Muchow et al. | |
| 7,582,534 B2 | 9/2009 | Afzali-Ardakani et al. | |
| 2008/0160265 A1* | 7/2008 | Hieslmair et al. | 428/208 |
| 2008/0283929 A1* | 11/2008 | Nabatame | 257/369 |
| 2008/0314288 A1 | 12/2008 | Biro et al. | |
| 2009/0081842 A1 | 3/2009 | Nelson et al. | |
| 2009/0162996 A1* | 6/2009 | Ramaswamy et al. | 438/477 |
| 2009/0203197 A1* | 8/2009 | Hanawa et al. | 438/513 |
| 2009/0236691 A1* | 9/2009 | Dyer et al. | 257/532 |
| 2010/0197128 A1* | 8/2010 | Schaeffer et al. | 438/591 |

OTHER PUBLICATIONS

Ho, Johnny C. et al., "Controlled nanoscale doping of semiconductors via molecular monolayers", nature materials, vol. 7, Jan. 2008, Published Online Nov. 11, 2007; www.nature.com/naturematerials, pp. 62-67.

* cited by examiner

*Primary Examiner* — Jae Lee
(74) *Attorney, Agent, or Firm* — Cantor Colburn LLP; Vazken Alexanian

(57) ABSTRACT

A process of doping a silicon layer with dopant atoms generally includes reacting a vapor of a dopant precursor with oxide and/or hydroxide reactive sites present on the silicon layer to form a self assembled monolayer of dopant precursor; hydrolyzing the self assembled monolayer of the dopant precursor with water vapor to form pendant hydroxyl groups on the dopant precursor; capping the self assembled monolayer with an oxide layer; and annealing the silicon layer at a temperature effective to diffuse dopant atoms from the dopant precursor into the silicon layer. Additional monolayers can be formed in a similar manner, thereby providing controlled layer-by-layer vapor phase deposition of the dopant precursor compounds for controlled doping of silicon.

15 Claims, 2 Drawing Sheets

VAPOR PHASE DEPOSITION PROCESSES FOR DOPING SILICON

BACKGROUND

This invention relates generally to vapor phase processes for doping a silicon layer, and more particularly, to controlled layer-by-layer vapor phase deposition of phosphorous, boron, arsenic, antimony compounds for controlled doping of silicon.

Miniaturization of silicon-based devices requires careful doping of the silicon contacts and/or channel regions. Standard doping approaches include high-energy ion implantation, which tends to produce problems such as amorphization of the silicon, and the like, which can significantly degrade device performance. Another approach that has been considered is doping through self-assembly of phosphorous or boron containing organic compounds followed by capping with an oxide layer and annealing step at high temperature to activate the dopants. Although the extent of doping can be controlled in this approach, the presence of carbonaceous species results in diffusion of carbon and the formation of unwanted carbides in the silicon.

Accordingly, there remains a need for improved doping processes for silicon.

SUMMARY

The shortcomings of the prior art are overcome and additional advantages are provided through the process of doping a silicon layer with dopant atoms comprising reacting a vapor of a dopant precursor with oxide and/or hydroxide reactive sites present on the silicon layer to form a self assembled monolayer of dopant precursor; hydrolyzing the self assembled monolayer of the dopant precursor with water vapor to form pendant hydroxyl groups on the dopant precursor; capping the self assembled monolayer with an oxide layer; and annealing the silicon layer at a temperature effective to diffuse dopant atoms from the dopant precursor into the silicon layer.

In another embodiment, an atomic layer deposition process for doping dopant atoms into a silicon layer on a substrate comprises reacting a dopant precursor vapor with reactive sites present on a surface of the silicon layer to form a monolayer of dopant precursor; reacting the dopant precursor monolayer with water vapor to form hydroxyl groups on the dopant precursor; forming an oxide layer on the monolayer; and annealing the substrate at a temperature and pressure effective to diffuse the dopant atoms from the dopant precursor monolayer into the silicon layer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

Figure 1:
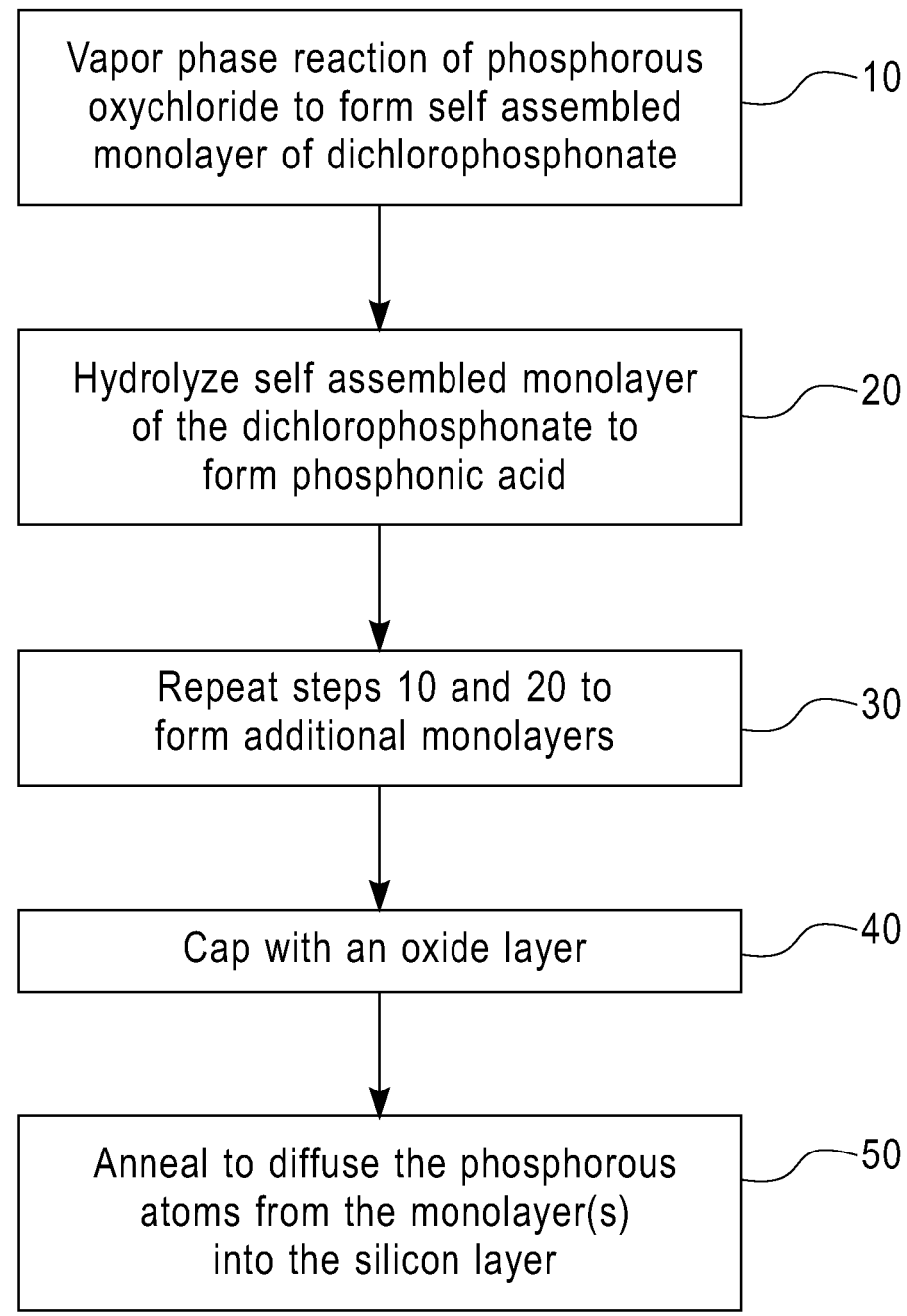
FIGS. 1-2 schematically illustrate an exemplary process for doping phosphorous atoms into a silicon layer.

The detailed description explains the preferred embodiments of the invention, together with advantages and features, by way of example with reference to the drawings.

DETAILED DESCRIPTION

Disclosed herein are processes for selectively doping controlled amounts of dopants in silicon. The process generally includes a vapor phase deposition process for forming a self-assembled monolayer(s) of a dopant precursor on a silicon surface, which is then hydrolyzed to form pendant hydroxyl substituents on the dopant precursor. The self assembled monolayer may then be capped with an oxide layer and subsequently annealed to diffuse the dopant atoms into the silicon layer. Optionally, one or more additional monolayers can be formed by vapor phase reacting an additional amount of the dopant precursor with the pendant hydroxyl substituents present in the dopant precursor of the self assembled monolayer followed by hydrolysis with water vapor. Multiple dopant containing monolayers can be formed in this manner. As such, the amount of dopant in the silicon layer can be carefully controlled by the number of monolayers formed prior to capping with the oxide layer and the subsequent annealing step.

The particular dopant is not intended to be limited so long as the dopant precursor can be vaporized and is reactive to oxide and/or hydroxide reactive sites present on the silicon surface. Suitable dopants include, without limitation, phosphorous atoms, arsenic atoms, boron atoms, antimony atoms, and the like. The dopant precursor of these dopant atoms should have a sufficiently high vapor pressure for vapor phase deposition. For example, the dopant precursor should be evaporable at temperatures of about 25° C. to about 150° C. and vacuum pressures of about 0.050 torr and about 0.50 torr.

By way of example, suitable phosphorous dopants include, without limitation, phosphorous oxychloride and tris-dimethylaminophsophine. A suitable borane precursor includes, without limitation, tri-dimethylamidoborane. A suitable antimony dopant precursor includes, without limitation, tris-dimethylamidoantimony.

For convenience in understanding of the invention, reference will now be made to doping phosphorous atoms using phosphorus oxychloride vapor, wherein the mechanism for forming the monolayers is substantially similar for the different dopant precursors. In this example, phosphorous oxychloride vapor reacts with oxide and/or hydroxide reactive sites present on the surface of the silicon layer to form a monolayer of dichlorophosphonate, such as reactive sites formed as a native oxide. The monolayer is then hydrolyzed to form a monolayer of phosphonic acid onto the silicon surface, capped with an oxide capping layer, and subsequently annealed to diffuse the phosphorous atoms into the silicon layer. Alternatively, one or more additional phosphorous containing monolayers can be formed by reaction of the phosphorus oxychloride precursor with the phosphonic acid monolayer, which can be subsequently hydrolyzed to form an additional monolayer of phosphonic acid, capped with an oxide layer and annealed as discussed above to diffuse the desired amount of phosphorous into the silicon layer. Advantageously, the reaction is relatively fast and can be carried out in the same toolset used for vapor deposition of oxide thin films. Moreover, careful control of the amount of phosphorous atoms in the silicon can be achieved by depositing a predetermined number of mono layers.

The vapor phase deposition process is not intended to be limited to any particular method. In one embodiment, the vapor phase deposition process is an atomic layer deposition process ("the ALD process"). The ALD process is generally preferred since all of the processing steps for doping the phosphorous atoms into the silicon can occur within the reactor, thereby minimizing the equipment and the footprint needed.

The ALD process generally refers to a process for producing thin films over a substrate molecular layer by molecular layer using self-saturating and self-limiting chemical reactions. Suitable ALD processes include, without limitation, both thermal ALD and plasma-enhanced ALD (PEALD) processes. In a typical ALD process, dopant precursors, also called gaseous reactants, are conducted into a reaction space in a reactor where they contact a substrate and react with the substrate surface in a self-limiting manner. The pressure and the temperature of the reaction chamber are adjusted to a range where physisorption (i.e. condensation of gases) and thermal decomposition of the precursors are avoided. Because of steric hindrance, only up to one monolayer (i.e., an atomic layer or a molecular layer) of material is deposited at a time during each pulsing cycle. Thus, the actual growth rate of the thin film, which is typically presented as Å/pulsing cycle, depends, for example, on the number of available reactive surface sites or active sites on the surface and bulkiness of the chemisorbing molecules. Gas phase reactions between dopant precursors and any undesired reactions of byproducts are inhibited because precursor pulses are separated from each other by time and the reaction chamber is purged with an inactive or inert gas (e.g. nitrogen, argon or hydrogen) and/or evacuated using, e.g., a pumping system between precursor pulses to remove surplus gaseous reactants and reaction byproducts from the chamber.

In the present invention, the dopant precursor is introduced in the vapor phase into the reaction space of the reactor. The dopant precursor reacts with reactive sites present on the surface of the silicon substrate, which include oxides and hydroxides of silicon. Because of steric hindrance, a monolayer of the reacted dopant precursor is formed. Water vapor is then introduced into the reaction space of the reactor in place of the dopant precursor so as to react with the dopant precursor, (e.g., P—Cl in the case of phosphorous oxychloride) in the dopant precursor to form pendant hydroxyl groups (e.g., P—OH in the case of phosphorous oxychloride). After formation of the pendant hydroxyl groups, the monolayer is again reactive to the dopant precursor. Thus, depending on the amount of doping desired, additional dopant containing monolayers can be formed and subsequently hydrolyzed with water vapor in the same manner as previously described. Once the desired amount of dopant containing monolayers is present on the silicon surface, the surface is capped with an oxide layer and subsequently annealed to diffuse the dopant atoms into the silicon layer, thereby activating the process of doping. Advantageously, each step in the process can be performed in the ALD reactor including the oxide capping layer. Alternatively, the oxide capping layer can be deposited by vacuum evaporation or sputtering as may be desired. Likewise, the annealing step can occur in the same ALD reactor or may be done in a Rapid Thermal Annealing reactor at temperatures generally about 800° C. to 1050° C., or alternatively, using a high powered laser.

Figure 2:
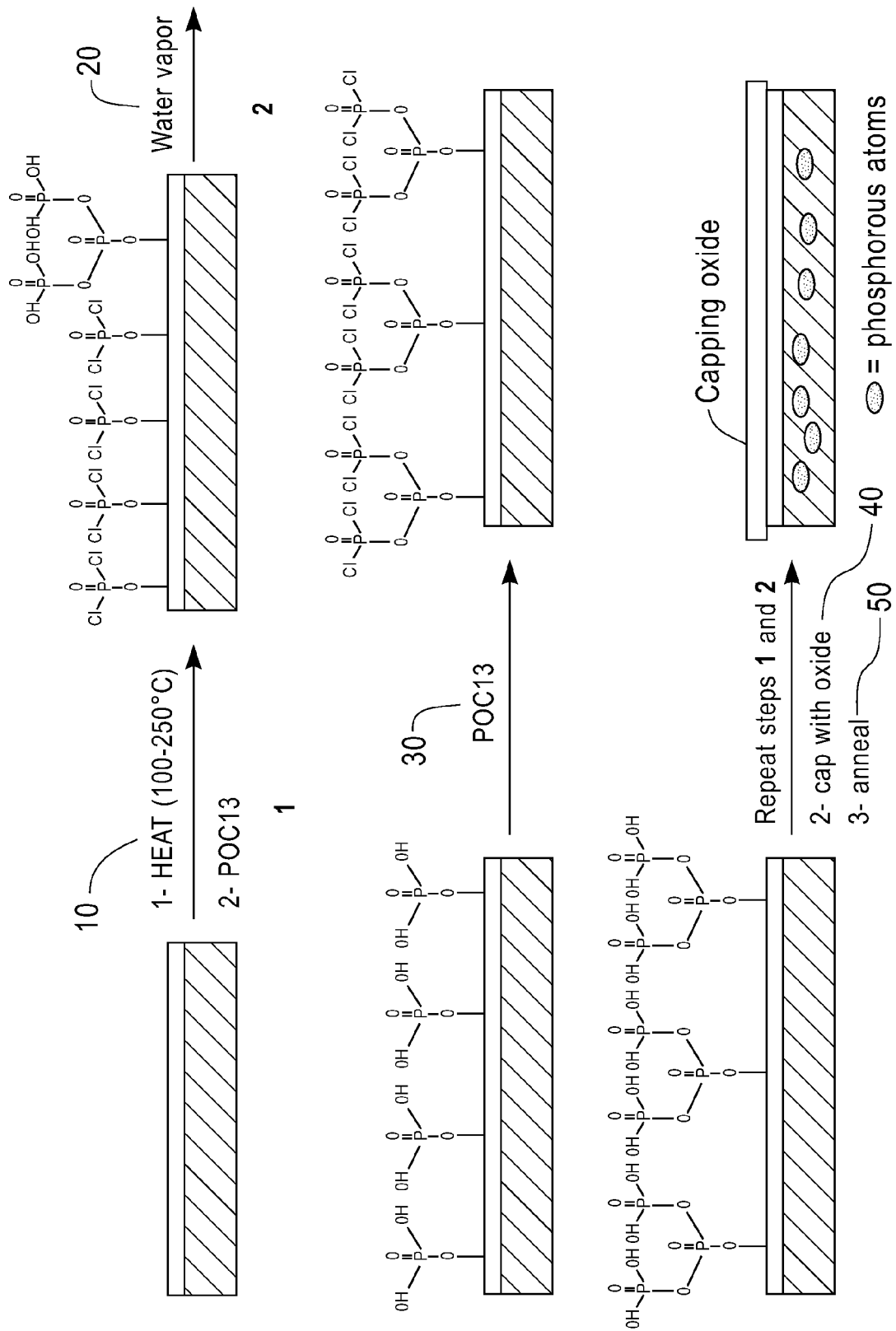

Turning now to the FIGS. 1-2, there is schematically shown an exemplary process for doping silicon with a controlled amount of phosphorous atoms. The process includes a first step 10 of introducing phosphorous oxychloride vapor into the reactor, which reacts with native oxide and/or hydroxide reactive sites present on the silicon surface of a substrate. To facilitate reaction of the phosphorous oxychloride with the reactive sites, the reactor is heated to a temperature of about 100° C. to about 250° C. and a pressure of about 50 mTorr to about 500 mTorr. The exposure is for about 2 milliseconds to 2 seconds. After this exposure, substantially all of the reactive sites present on the silicon surface are converted to a self-assembled monolayer of dichlorophosphonate.

In step 20, the reactor purged and the phosphorous oxychloride vapor is replaced with water vapor. The water vapor is introduced into the reactor in an amount effective to hydrolyze the dichlorophosphonate to form phosphonic acid. That is, the P—Cl bonds are replaced with P—OH bonds. After formation of the P—OH bonds, the surface is again reactive or alternatively, may be capped with an oxide and annealed as described in steps 30 and 40.

If additional phosphorous is desired, an additional monolayer can be formed by reaction of the phosphorous oxychloride with the P—OH reactive sites followed by hydrolysis. The process can be repeated to form as many monolayers as desired, thereby providing an end user with control as to how much phosphorous is subsequently activated in the silicon.

Once the desired amount of phosphorous is formed on the surface of the silicon layer, an oxide-capping layer is deposited onto the phosphorous containing monolayer(s) as shown in step 30. The particular oxide-capping layer is not intended to be limited to any particular type. Preferably, the precursor for the oxide-capping layer can be formed into a vapor and deposited in the ALD reactor. In this manner, the phosphorous oxychloride is replaced with the oxide-capping precursor. By way of example, trimethylaluminum in the vapor phase can be introduced into the reactor to form an aluminum oxide capping layer. Other suitable oxide layer precursors include, without limitation, hafnium oxide or titanium oxide, and the like. These precursors can be used to form oxide layers such as aluminum oxide, tetraalkoxyhafnium or tetraalkoxytitanium, and the like. In one embodiment, the thickness of the oxide layer is about 2 nanometers (nm) to 10 nm.

In step 40, the oxide-capped substrate is annealed at a temperature and for a period of time effective to diffuse the phosphorous atoms provided by the monolayers into the silicon layer, thereby activating the process of doping. In one embodiment, the silicon substrate is annealed at a temperature of about 500° C. to about 1000° C.

The following examples are presented for illustrative purposes only, and are not intended to limit the scope of the invention.

EXAMPLES

In this example, a silicon substrate was reacted with a vapor of tris-dimethylaminophosphine at 90° C. for 5 seconds. The reactor was then evacuated followed by a hydrolysis reaction with water vapor at 90° C. for 30 seconds followed by evacuation. These steps were repeated three times and then a thin layer of aluminum oxide (10 nm) was deposited by atomic layer deposition to cap the phosphorous-containing layer. The capped substrate was then annealed by rapid thermal annealing under nitrogen atmosphere at 950° C. for 5 seconds to diffuse the phosphorous atoms into the silicon substrate. The surface resistivity of the doped substrate was measured at 80-100 Ohm/square.

The flow diagram in FIG. 1 is just an example. There may be many variations to this diagram or the steps (or operations) described therein without departing from the spirit of the invention. For instance, the steps may be performed in a differing order, or steps may be added, deleted or modified. All of these variations are considered a part of the claimed invention.

The foregoing description of the embodiments of this invention has been presented for purposes of illustration and description. It is not intended to be exhaustive or to limit the invention to the precise form disclosed, and many modifications and variations are possible. Such modifications and variations that may be apparent to a person skilled in the art are intended to be included within the scope of this invention as defined by the accompanying claims.

What is claimed is:

1. A process of doping a silicon layer with dopant atoms, comprising:
   reacting a vapor of a single dopant precursor of phosphorous oxychloride with oxide and/or hydroxide reactive sites present on the silicon layer to form a self assembled monolayer of dichlorophosphonate, wherein the single dopant precursor is the only precursor reacted with the oxide and/or hydroxide reactive sites present on the silicon layer and deposited onto the silicon layer;
   hydrolyzing the self assembled monolayer of the dichlorophosphonate with water vapor to form phosphinic acid;
   capping the self assembled monolayer of the single dopant precursor with the phosphinic acid with an oxide layer, wherein the oxide layer is selected from the group consisting of aluminum oxide, tetralkoxyhafnium, and tetralkoxytitanium; and
   annealing the silicon layer at a temperature effective to diffuse dopant atoms from the dopant precursor into the silicon layer.

2. The process of claim 1, wherein the reacting, the hydrolyzing, the capping, and the annealing comprise a sequential vapor phase reaction process.

3. The process of claim 1, wherein subsequent to the hydrolyzing and prior to the capping of the self assembled monolayer, the process further comprises forming at least one additional self assembled monolayer of dichlorophosphonate by vapor phase reacting an additional amount of the dopant precursor with the pendant hydroxyl groups of the phosphinic acid and hydrolyzing the additional amount of the dopant precursor with water vapor to form phosphinic acid in the at least one additional self assembled monolayer of the dichlorophosphonate.

4. The process of claim 1, wherein the vapor phase reaction is an atomic vapor deposition process.

5. The process of claim 1, wherein reacting the dopant precursor with the oxide and/or hydroxide reactive sites present on the silicon layer is at a temperature of 100 to 250° C. and a pressure of 50 to 500 mTorr.

6. The process of claim 1, wherein capping the self assembled monolayer of the phosphonic acid with the oxide layer comprises introducing trimethyaluminum as a vapor and forming aluminum oxide as the oxide layer.

7. The process of claim 1, wherein the oxide layer has a thickness of 2 to 10 nanometers.

8. The process of claim 1, wherein capping the self assembled monolayer with an oxide layer comprises atomic vapor deposition, vacuum evaporation, or sputtering.

9. The process of claim 1, wherein annealing to diffuse the dopant atoms from the dopant precursor into the silicon layer comprises a rapid thermal annealing process at a temperature of about 800° C. to about 1050° C. or a high power laser process.

10. An atomic layer deposition process for doping dopant atoms into a silicon layer on a substrate, comprising:
    reacting a single dopant precursor vapor of phosphorous oxychloride with reactive sites present on a surface of the silicon layer to form a monolayer of dichlorophosphonate, wherein the single dopant precursor is the only precursor reacted with the reactive sites present on the silicon layer and deposited onto the silicon layer;
    reacting the dichlorophosphonate monolayer with water vapor to form hydroxyl groups;
    forming an oxide layer on the monolayer including the pendant hydroxyl groups, wherein the oxide layer is selected from the group consisting of aluminum oxide, tetralkoxyhafnium, and tetralkoxytitanium; and
    annealing the substrate at a temperature and pressure effective to diffuse the dopant atoms from the dichlorophosphonate monolayer with the hydroxyl groups into the silicon layer.

11. The atomic layer deposition process of claim 10, wherein subsequent to reacting the dichlorophosphonate monolayer with the water vapor and prior to forming the oxide layer, the atomic layer deposition process further comprises forming at least one additional monolayer by vapor phase reacting an additional amount of the phosphorous oxychloride with the hydroxyl groups on the dichlorophosphonate monolayer and reacting the additional monolayer with water vapor to form pendant hydroxyl groups in the at least one additional dichlorophosphonate monolayer.

12. The atomic layer deposition process of claim 10, wherein the reactive sites comprise native oxide and/or hydroxide reactive sites present on the silicon layer.

13. The atomic layer deposition process of claim 10, wherein reacting the phosphorous oxychloride vapor with the reactive sites is at a temperature of 100 to 250° C. and a pressure of 50 to 500 mTorr.

14. The atomic layer deposition process of claim 10, wherein forming an oxide layer comprises introducing trimethylaluminum as a vapor and forming aluminum oxide.

15. The atomic layer deposition process of claim 10, wherein the oxide layer has a thickness of 2 to 10 nanometers.

* * * * *